(12) United States Patent
Wan et al.

(10) Patent No.: US 10,342,159 B2
(45) Date of Patent: Jul. 2, 2019

(54) LIQUID HEAT-DISSIPATING ASSEMBLY

(71) Applicant: Man Zai Industrial Co., Ltd., Tainan (TW)

(72) Inventors: Cheng-Chien Wan, Tainan (TW); Cheng-Feng Wan, Tainan (TW); Hao-Hui Lin, Tainan (TW); Hsiao-Ching Chen, Tainan (TW); Wei-Che Hsiao, Tainan (TW); Tung-Hsin Liu, Tainan (TW)

(73) Assignee: Man Zai Industrial Co., Ltd., Tainan (TW)

( * ) Notice: Subject to any disclaimer, the term of this patent is extended or adjusted under 35 U.S.C. 154(b) by 72 days.

(21) Appl. No.: 15/679,388

(22) Filed: Aug. 17, 2017

(65) Prior Publication Data

US 2018/0063992 A1    Mar. 1, 2018

(30) Foreign Application Priority Data

Aug. 24, 2016    (TW) .............................. 105212872 U

(51) Int. Cl.
*H05K 7/20* (2006.01)
*F28F 3/14* (2006.01)
*F28D 21/00* (2006.01)

(52) U.S. Cl.
CPC ........... *H05K 7/20263* (2013.01); *F28F 3/14* (2013.01); *H05K 7/20254* (2013.01); *H05K 7/20272* (2013.01); *F28D 2021/0029* (2013.01)

(58) Field of Classification Search
CPC combination set(s) only.
See application file for complete search history.

(56) References Cited

U.S. PATENT DOCUMENTS

| 4,770,240 A | * | 9/1988 | Dawson | F28F 9/0214 165/176 |
| 4,771,366 A | * | 9/1988 | Blake | G06F 1/189 257/713 |
| 9,101,079 B2 | * | 8/2015 | Aoki | H05K 7/20263 |

(Continued)

FOREIGN PATENT DOCUMENTS

| EP | 0676593 A1 | * | 10/1995 | ............ F28F 9/0214 |
| JP | 02040495 A | * | 2/1990 | ......... F28D 1/05366 |

(Continued)

*Primary Examiner* — Devon Russell
(74) *Attorney, Agent, or Firm* — C. G. Mersereau; DeWitt LLP

(57) ABSTRACT

A liquid heat-dissipating assembly has a heat-guiding tube assembly, multiple heat-dissipating units, and at least one heat-dissipating tube. The heat-guiding tube assembly has a first tube, a second tube, and a separating segment. The first tube has at least one first channel. The second tube has at least one second channel. The separating segment is mounted between the first tube and the second tube. The heat-dissipating units are connected with the heat-guiding tube assembly, and each heat-dissipating unit has a heat-dissipating body, a first pipe, and a second pipe. The heat-dissipating body has a passage. The first pipe is connected with the passage and the at least one first channel. The second pipe is connected with the passage and the at least one second channel. The at least one heat-dissipating tube is connected with the at least one second channel of the second tube.

12 Claims, 10 Drawing Sheets

(56) References Cited

U.S. PATENT DOCUMENTS

| | | | | |
|---|---|---|---|---|
| 9,696,094 B2* | 7/2017 | Aoki | .................... | F28D 1/0476 |
| 2013/0107457 A1* | 5/2013 | Campbell | .......... | H05K 7/20272 |
| | | | | 361/699 |
| 2015/0060027 A1* | 3/2015 | Tawa | .................... | B21D 53/02 |
| | | | | 165/143 |
| 2016/0345466 A1* | 11/2016 | Arvelo | ............... | H05K 7/20272 |
| 2017/0347486 A1* | 11/2017 | Schaltz | ............. | H05K 7/20254 |

FOREIGN PATENT DOCUMENTS

| | | | | | |
|---|---|---|---|---|---|
| JP | | 05215474 A | * 8/1993 | ............ | F28F 9/0214 |
| JP | | 2012204554 A | * 10/2012 | ........... | F28D 1/0476 |

\* cited by examiner

US 10,342,159 B2

LIQUID HEAT-DISSIPATING ASSEMBLY

BACKGROUND OF THE INVENTION

1. Field of the Invention

The present invention relates to a heat-dissipating assembly, and more particularly to a liquid heat-dissipating assembly.

2. Description of Related Art

Electrical devices or equipment will generate heat during operations. To keep the electrical devices from being crashed or damaged due to high temperature, a heat-dissipating assembly is usually mounted in an electrical device. With the arrangement of the heat-dissipating assembly, the heat generated by the electrical device can be dissipated.

A liquid heat-dissipating assembly is one kind of cooling device for electrical devices. The conventional liquid heat-dissipating assembly substantially comprises a heat-guiding unit attached to a heat source in an electrical device. The heat-guiding unit has a passage formed in the heat-guiding unit and having two ends. One of the ends of the passage is connected with an output port of a cooling liquid source with an inlet pipe, and the other end of the passage is connected with an input port of the cooling liquid source with an outlet pipe. Accordingly, a cooling liquid, such as water or coolant, in low temperature can be led into the heat-guiding unit via the inlet pipe to absorb the heat generated by the electrical device, and the temperature of the electrical device can be lowered down. The heated cooling liquid will be led into the liquid source via the outlet pipe. With a heat-dissipating device mounted on the liquid source, the temperature of the cooling liquid can be lowered down and the cooling liquid is discharged out to the heat-guiding unit to form a cycling loop for dissipating the heat generated by the electrical device.

However, when the amount of the heat sources in an electrical device increases, the amount of the heat-guiding units has also to be increased accordingly. Each heat-guiding unit has to be connected with an individual inlet pipe and an individual outlet pipe to the liquid source, but the pipes of the conventional liquid heat-dissipating assembly cannot be well arranged. Thus, the pipe arrangement of the conventional liquid heat-dissipating assembly is complicated, and the volume of the whole liquid heat-dissipating assembly is large.

To overcome the shortcomings, the present invention tends to provide a liquid heat-dissipating assembly to mitigate or obviate the aforementioned problems.

SUMMARY OF THE INVENTION

The main objective of the invention is to provide a liquid heat-dissipating assembly that has an excellent heat-dissipating effect.

The liquid heat-dissipating assembly has a heat-guiding tube assembly, multiple heat-dissipating units, and at least one heat-dissipating tube. The heat-guiding tube assembly has a first tube, a second tube, and a separating segment. The first tube has at least one first channel defined in the first tube and a first peripheral wall formed around the at least one first channel. The second tube is adjacent to and spaced from the first tube and has at least one second channel defined in the second tube and a second peripheral wall formed around the at least one second channel. The separating segment is mounted between the first tube and the second tube and has a separating channel and multiple connection walls arranged around the separating channel and connected with the first peripheral wall and the second peripheral wall. The heat-dissipating units are connected with the heat-guiding tube assembly, and each heat-dissipating unit has a heat-dissipating body, a first pipe, and a second pipe. The heat-dissipating body has a passage defined in the heat-dissipating body and having two ends defined respectively as an inlet and an outlet. The first pipe has two ends respectively connected with the inlet of the passage of the heat-dissipating body and the at least one first channel of the first tube. The second pipe has two ends respectively connected with the outlet of the passage of the heat-dissipating body and the at least one second channel of the second tube. The at least one heat-dissipating tube is connected with the at least one second channel of the second tube.

Other objects, advantages and novel features of the invention will become more apparent from the following detailed description when taken in conjunction with the accompanying drawings.

DETAILED DESCRIPTION OF PREFERRED EMBODIMENT

Figure 1:
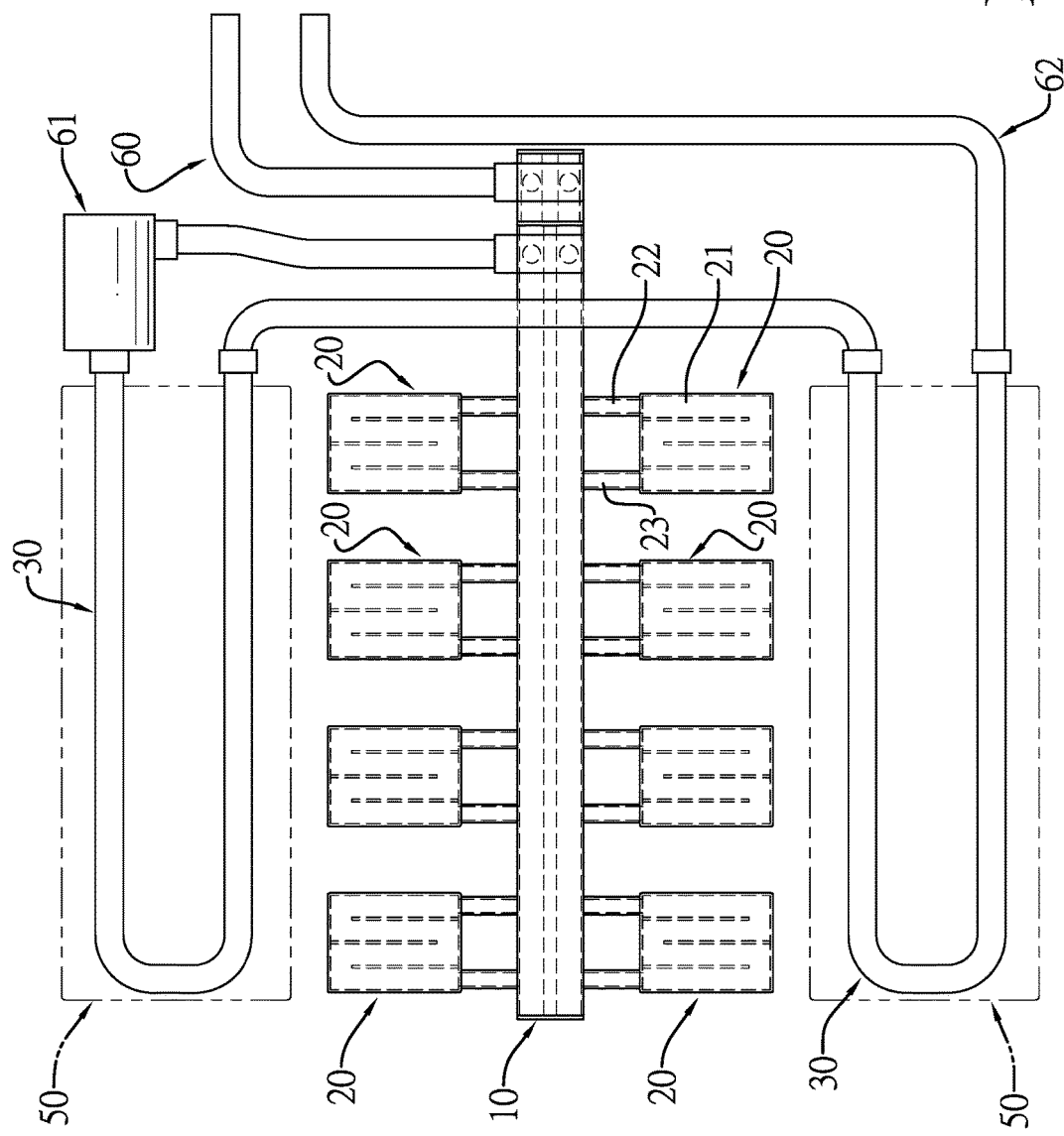
FIG. 1 is a top view of a preferred embodiment of a liquid heat-dissipating assembly in accordance with the present invention.

With reference to FIG. 1, a liquid heat-dissipating assembly in accordance with the present invention comprises a heat-guiding tube assembly 10, multiple heart-dissipating units 20, and at least one heat-dissipating tube 30.

Figure 2:
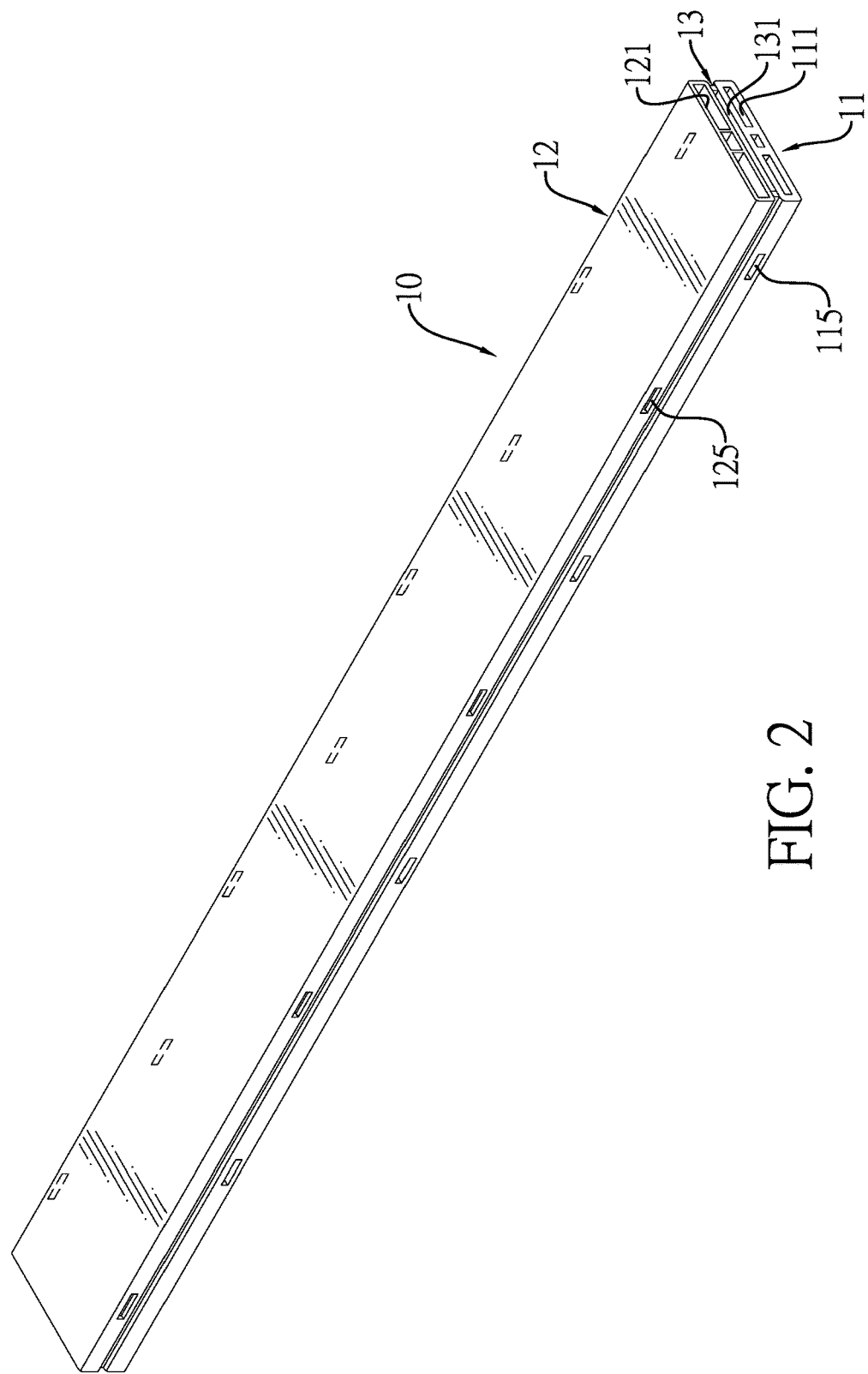
FIG. 2 is an enlarged perspective view of the heat-guiding tube assembly of the liquid heat-dissipating assembly in FIG. 1.
Figure 3:
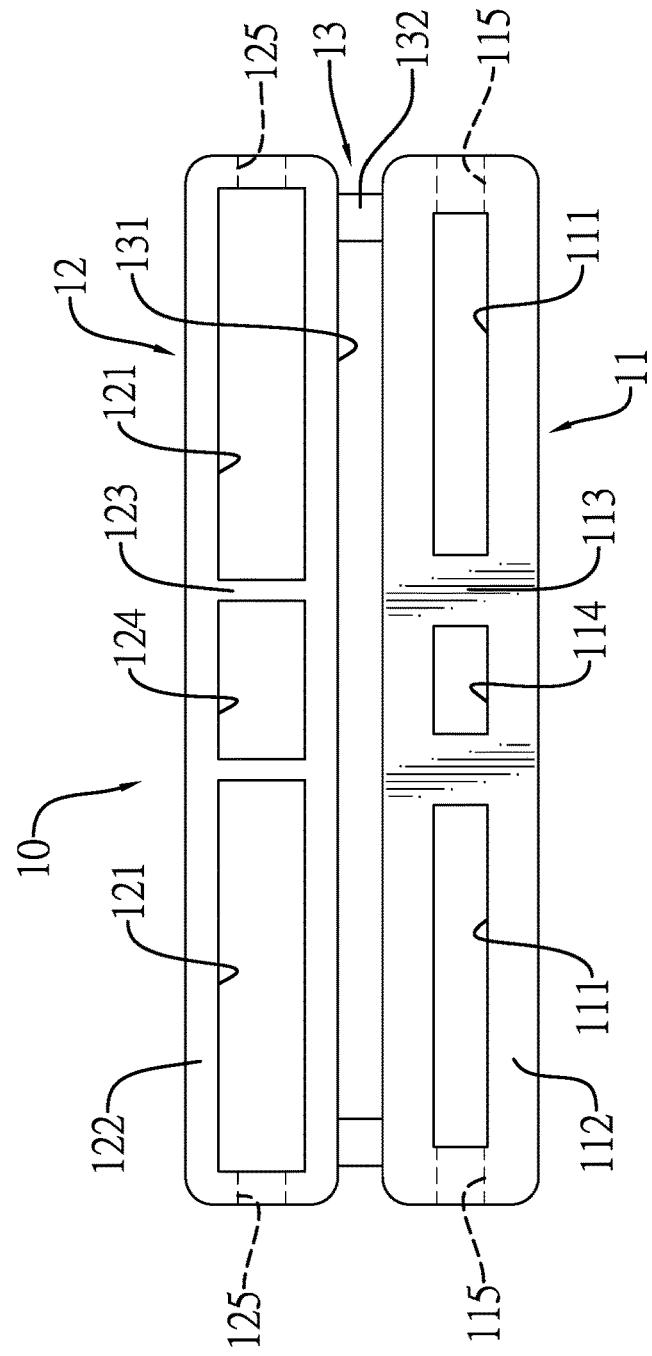
FIG. 3 is an enlarged end view of the heat-guiding tube assembly in FIG. 2.

With reference to FIGS. 2 and 3, the heat-guiding tube assembly 10 comprises a first tube 11, a second tube 12, and a separating segment 13. The first tube 11 has at least one first channel 111 defined in the first tube 11 and a first peripheral wall 112 formed around the at least one first channel 111. The second tube 12 is adjacent to and spaced from the first tube 11 and has at least one second channel 121 defined in the second tube 12 and a second peripheral wall 122 formed around the at least one second channel 121. The separating segment 13 is mounted between the first tube 11 and the second tube 12 and comprises a separating channel 131 and multiple connection walls 132. The connection walls 132 are arranged around the separating channel 131 and are connected with the first peripheral wall 112 and the second peripheral wall 122.

Preferably, the at least one first channel 111 is implemented as multiple in amount, and a first baffle 113 is formed between each pair of adjacent two of the multiple first channels 111. Each first baffle 113 has a first spacing channel 114 defined in the first baffle 113. The at least one second channel 121 is implemented as multiple in amount, and a second baffle 123 is formed between each pair of adjacent two of the multiple second channels 121. Each second baffle 123 has a second spacing channel 124 defined in the second baffle 123.

In addition, in the preferred embodiment, the first tube 11 has a flat rectangular cross section, and two first channels 111 are implemented in the first tube 11. One first baffle 113 is implemented in the first tube 11 and between the two first channels 111. The two first channels 111 and the first spacing channel 114 extend along a length of the first tube 11. The second tube 12 has a flat rectangular cross section, and two second channels 121 are implemented in the second tube 12. One second baffle 123 is implemented in the second tube 12 and between the two second channels 121, and the two second channels 121 and the second spacing channel 124 extend along a length of the second tube 12.

With reference to FIG. 1, each first channel 111 of the first tube 11 has a closed end and an open end, and each second channel 121 of the second tube 12 has a closed end and an open end. The closed ends of the first channels 111 and the closed ends of the second channels 121 may be located at a same end or respectively at opposite ends of the heat-guiding tube assembly 10. In the preferred embodiment, the closed ends of the first channels 111 and the closed ends of the second channels 121 are located at a same end of the heat-guiding tube assembly 10. The open ends of the first channels 111 are connected to a heat-dissipating liquid source that has a lower temperature. The open ends of the second channels 121 are applied as outlets for the heat-dissipating liquid source that has been transferred with heat.

Figure 4:
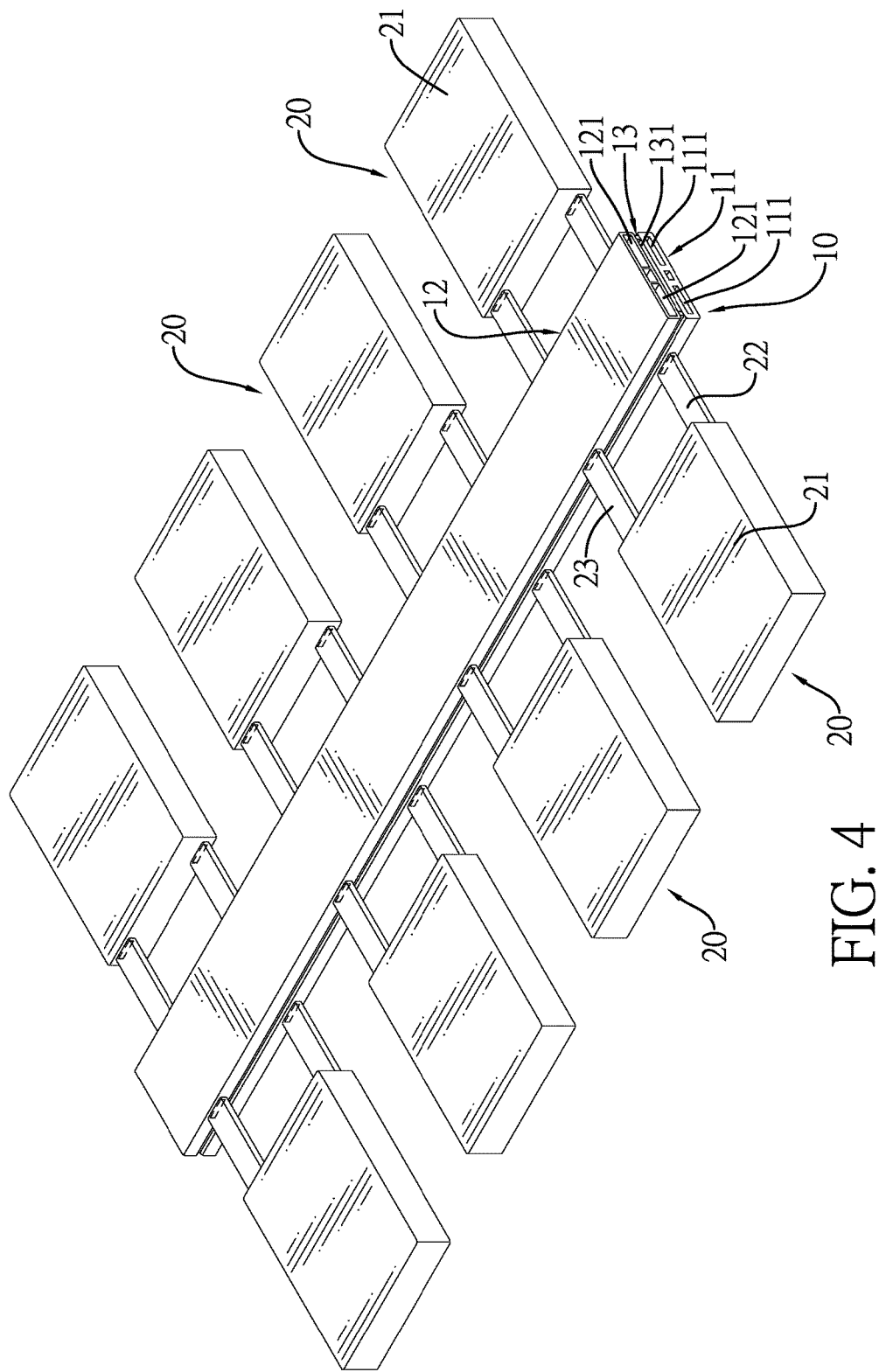
FIG. 4 is an enlarged perspective view of the heat-guiding tube assembly and the multiple heat-dissipating units of the liquid heat-dissipating assembly in FIG. 1.
Figure 6:
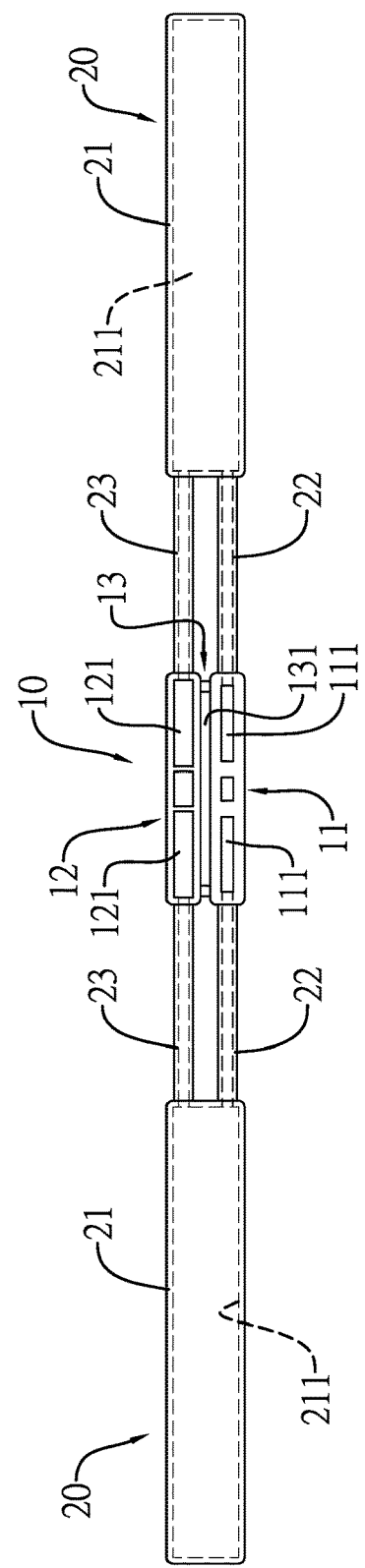
FIG. 6 is an end view of the heat-guiding tube assembly and the multiple heat-dissipating units in FIG. 4.

With reference to FIGS. 1, 4, and 6, the heat-dissipating units 20 are arranged around the heat-guiding tube assembly 10 and are connected with the heat-guiding tube assembly 10, and each heat-dissipating unit 20 comprises a heat-dissipating body 21, a first pipe 22, and a second pipe 23. The heat-dissipating body 21 is made of a heat-transferring material and has a passage 211 defined in the heat-dissipating body 21. The passage 211 has two ends defined respectively as an inlet and an outlet. The first pipe 22 has two ends respectively connected with the inlet of the passage 211 of the heat-dissipating body 21 and the first channels 111 of the first tube 11. The second pipe 23 has two ends respectively connected with the outlet of the passage 211 of the heat-dissipating body 21 and the second channels 121 of the second tube 12.

Figure 5:
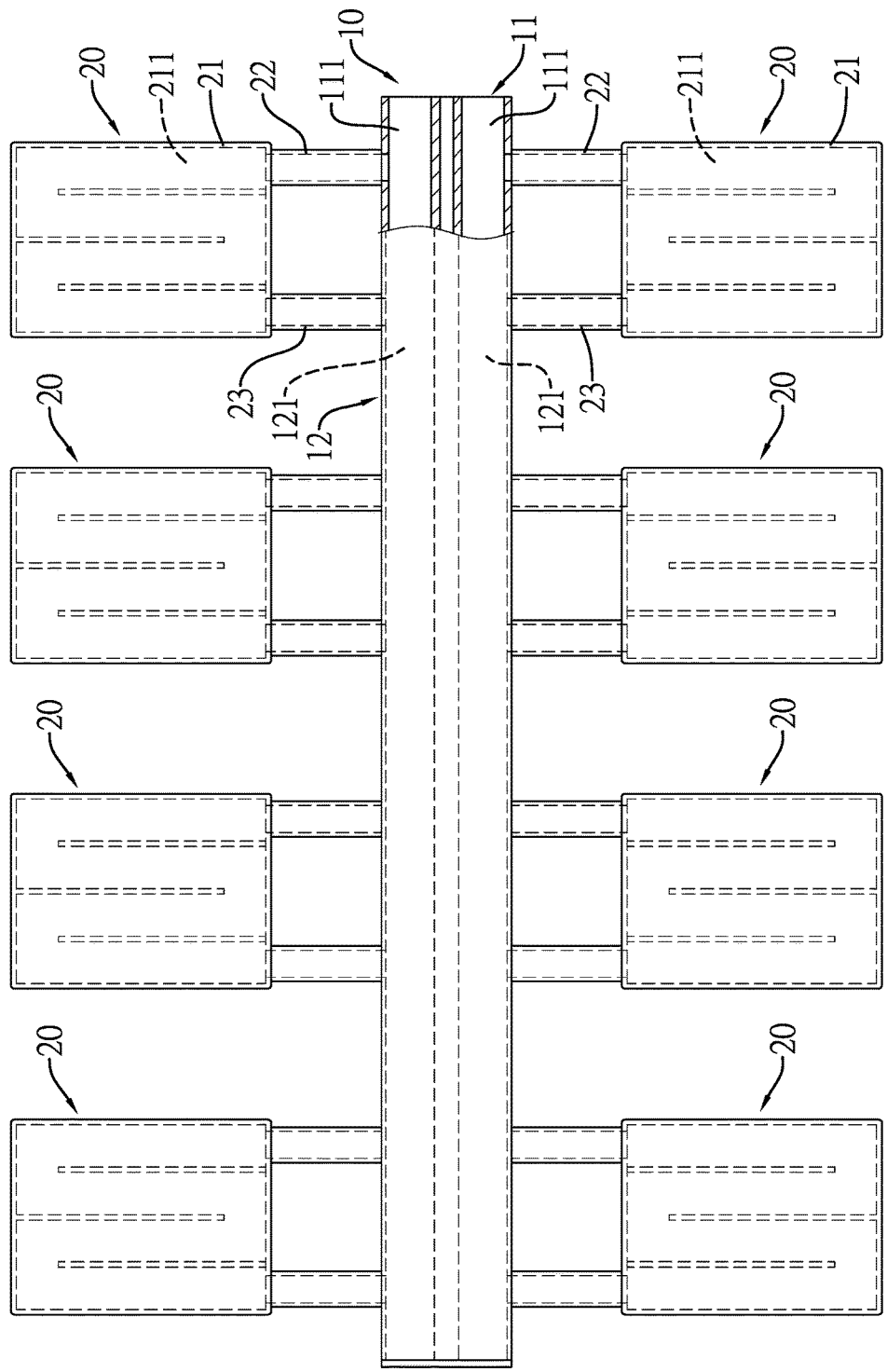
FIG. 5 is a top view in partial section of the heat-guiding tube assembly and the multiple heat-dissipating units in FIG. 4.

With reference to FIGS. 4 to 6, in the preferred embodiment, the heat-guiding tube assembly 10 is connected with the heat-dissipating units 20 in parallel. The first tube 11 is located below the second tube 12. The first tube 11 has multiple first connecting holes 115 defined through the first peripheral wall 112 and communicates with the first channels 111. The second tube 12 has multiple second connecting holes 125 defined through the second peripheral wall 122 and communicates with the second channels 121. The two ends of each first pipe 22 are respectively connected with the inlet of the passage 211 of the heat-dissipating body 21 and one of the first connecting holes 115 in the first tube 11. The two ends of each second pipe 23 are respectively connected with the outlet of the passage 211 of the heat-dissipating body 21 and one of the second connecting holes 125 in the second tube 12.

Figure 7:
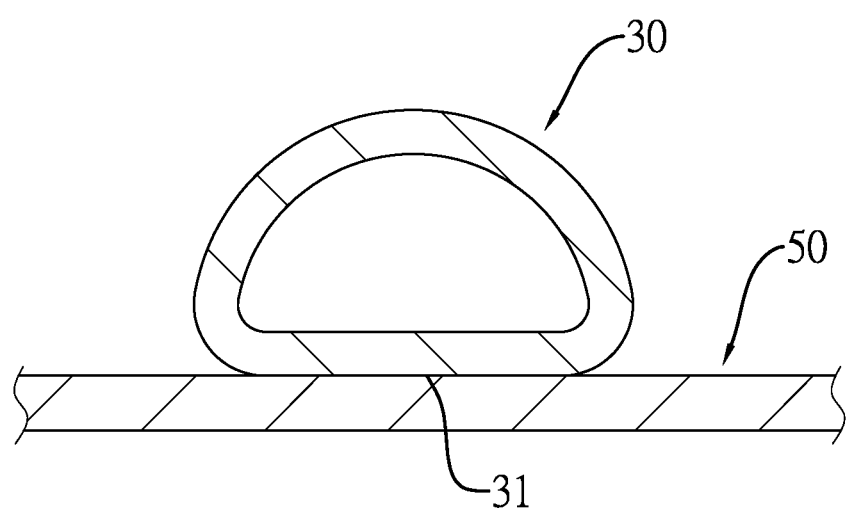
FIG. 7 is an enlarged cross sectional end view of a heat-dissipating tube of the liquid heat-dissipating assembly in FIG. 1 attached to a surface of a heat source.

With reference to FIGS. 1 and 7, the at least one heat-dissipating tube 30 is made of heat-transferring material and is connected with the second channels 121 of the second tube 12. Preferably, each one of the at least one heat-dissipating tube 30 has a flat surface 31. The flat surface 31 of each heat-dissipating tube 30 is applied to be in contact with a heat source 50 to enlarge the contact area for heat-transferring. The amount of the at least one heat-dissipating tube 30 can be changed based on the amount of the heat source 50. When multiple heat-dissipating tubes 30 are implemented, the heat-dissipating tubes 30 can be connected with the second channels 121 in the second tube 12 in series or in parallel. With reference to FIG. 1, the heat-dissipating tubes 30 are connected with the second channels 121 in the second tube 12 in series.

Figure 8:
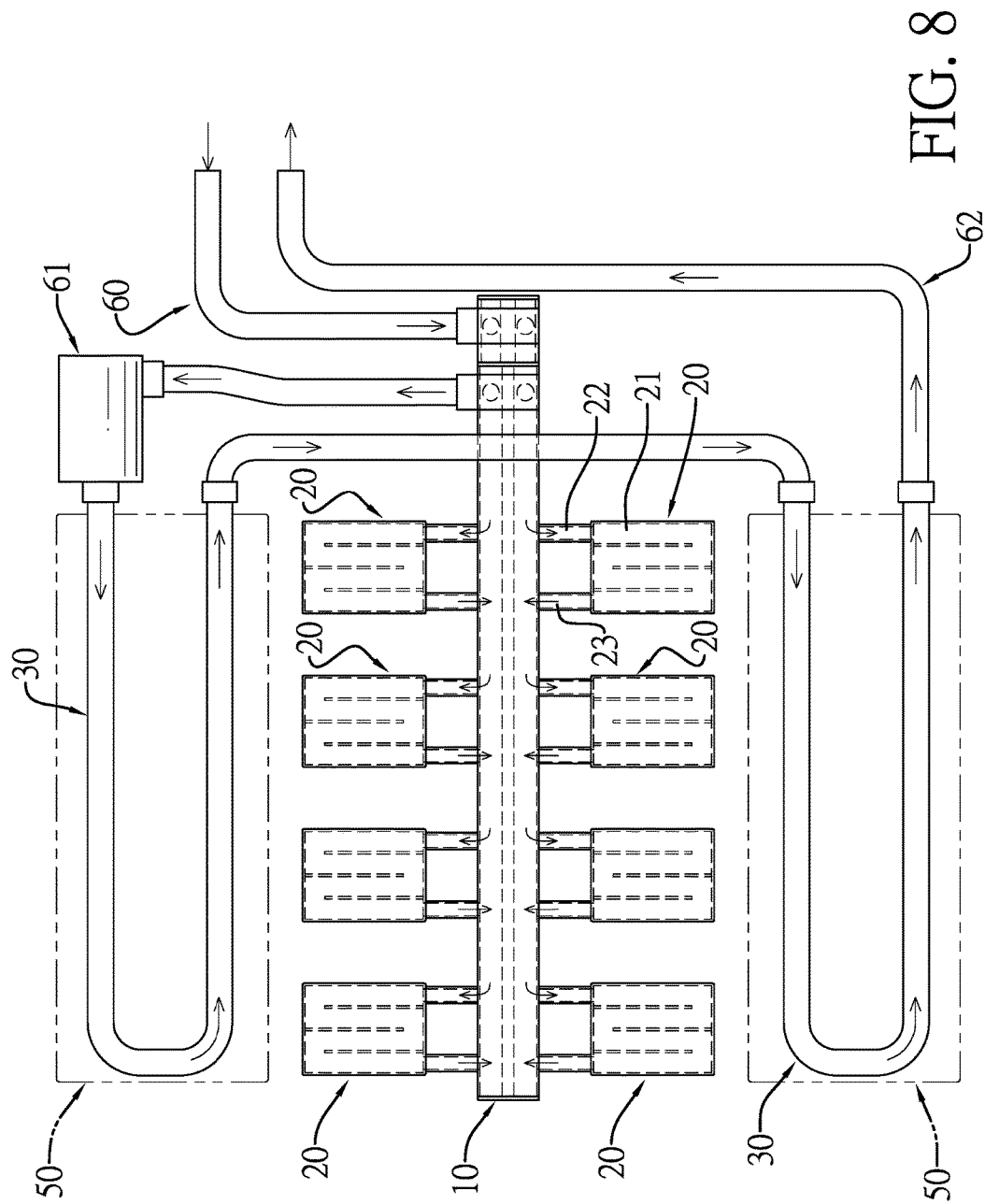
FIG. 8 is an operational top view of the liquid heat-dissipating assembly in FIG. 1.
Figure 9:
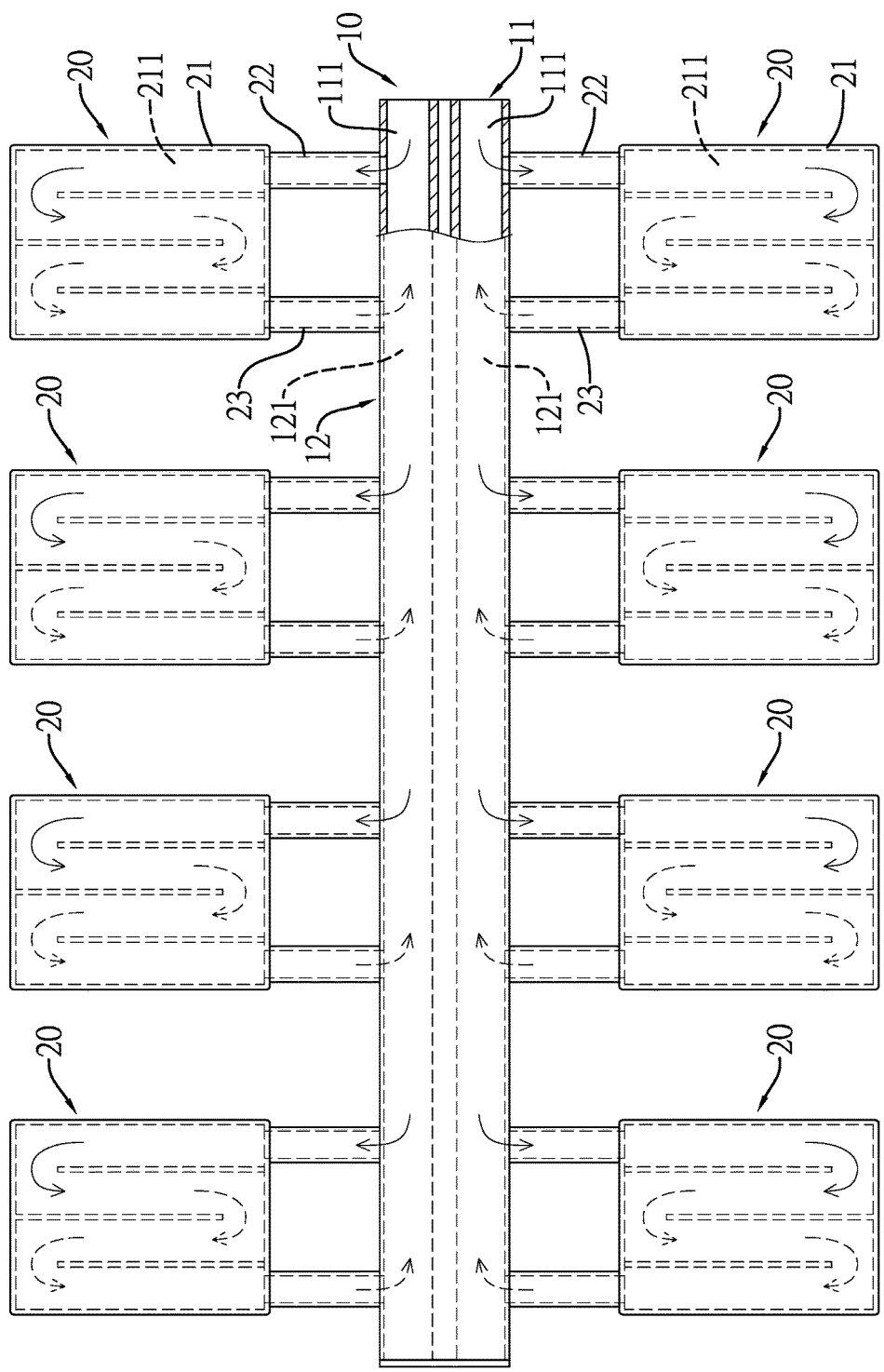
FIG. 9 is an operational top view in partial section of the heat-guiding tube assembly and the multiple heat-dissipating units of the liquid heat-dissipating assembly in FIG. 1.
Figure 10:
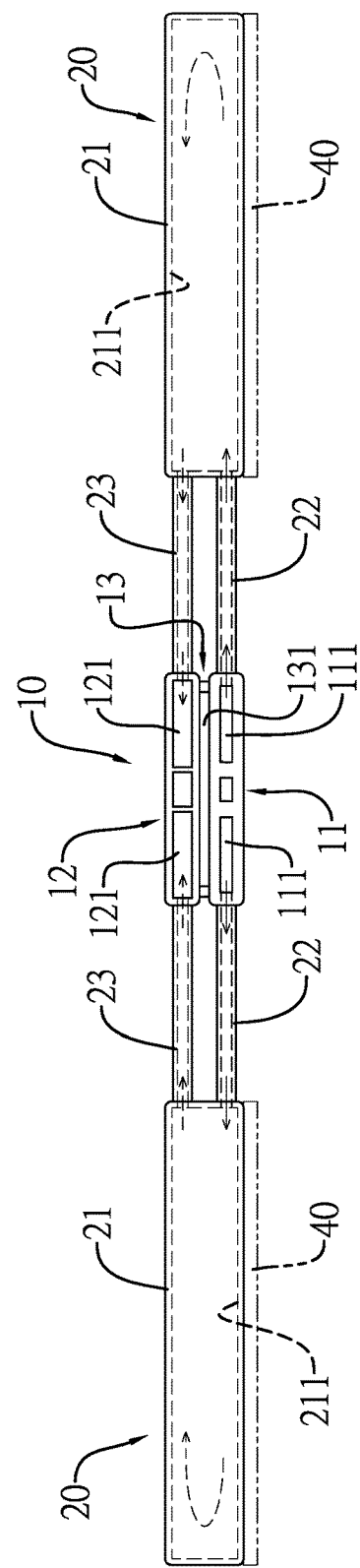
FIG. 10 is an operational end view of the heat-guiding tube assembly and the multiple heat-dissipating units of the liquid heat-dissipating assembly in FIG. 1.

With reference to FIGS. 8 to 10, in use, the heat-dissipating bodies 21 of the heat-dissipating units 20 are attached to heat generating portions of a heat source 40. The multiple heat-dissipating tubes 30 connected with each other in series are attached to a heat source 50 that has a high temperature. The first tube 11 of the heat-guiding tube assembly 10 is connected with an input tube 60 to lead the heat-dissipating liquid into the heat-guiding tube assembly 10. The second tube 12 is connected with ends of the heat-dissipating tubes 30 that are connected with each other in series via a connecting pipe 61. The other ends of the heat-dissipating tubes 30 are connected with an output tube 62.

The heat generated by the heat source 40 can be transferred to the heat-dissipating bodies 21, and the heat generated by the heat source 50 can be transferred to the heat-dissipating tubes 30. The heat-dissipating liquid having a low temperature, such as water or coolant, can be led into the first channels 111 in the first tube 11 via the input tube 60 and enters the heat-dissipating bodies 21 via the first channels 111 and the first pipes 22. While the heat-dissipating liquid passes through the passages 211 in the heat-dissipating bodies 21, heat exchange is proceeding and the temperature of the heat source 40 can be lowered. The heat-dissipating liquid then flows into the second channels 121 in the second tube 12 via the second pipes 23, and flows into the heat-dissipating tubes 30 via the second channels 121 in the second tube 12. Consequently, the temperature of the heat source 50 can be lowered down. Finally, the heat-dissipating liquid flows to the heat-dissipating source via the output tube 62. After a cooling process in the heat-dissipating source, the heat-dissipating liquid can be led into the first channels 111 in the first tube 11 of the heat-guiding tube assembly 10 again. Accordingly, the heat sources 40, 50 can be repeatedly cooled down for a long term of use.

With reference to FIG. 10, because the separating segment 13 is mounted between the first tube 11 and the second tube 12 and a separating channel 131 is defined in the separating segment 13, an air separating layer is formed between the first tube 11 and the second tube 12. Accordingly, the heat in the heat-dissipating liquid in the second channels 121 that has a high temperature will not be transferred to the heat-dissipating liquid in the first channels 111 that has a low temperature. Therefore, the heat-dissipating assembly can provide an excellent heat-dissipating effect to the heat sources 40, 50.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid heat-dissipating assembly comprising:
a heat-guiding tube assembly comprising
a first tube having at least one first channel defined in the first tube and a first peripheral wall formed around the at least one first channel;
a second tube being adjacent to and spaced from the first tube and having at least one second channel defined in the second tube and a second peripheral wall formed around the at least one second channel; and
a separating segment mounted between the first tube and the second tube and comprising a separating channel and multiple connection walls arranged around the separating channel and connected with the first peripheral wall and the second peripheral wall;
multiple heat-dissipating units connected with the heat-guiding tube assembly, and each heat-dissipating unit comprising
a heat-dissipating body having a passage defined in the heat-dissipating body and having two ends defined respectively as an inlet and an outlet;
a first pipe having two ends respectively connected with the inlet of the passage of the heat-dissipating body and the at least one first channel of the first tube; and
a second pipe having two ends respectively connected with the outlet of the passage of the heat-dissipating body and the at least one second channel of the second tube; and
at least one heat-dissipating tube connected with the at least one second channel of the second tube, wherein the at least one first channel includes multiple first channels; and
a first baffle is formed between each pair of adjacent two of the multiple first channels and has a first spacing channel defined in the first baffle.

2. The liquid heat-dissipating assembly as claimed in claim 1, wherein the at least one second channel includes multiple second channels; and
a second baffle is formed between each pair of adjacent two of the multiple second channels and has a second spacing channel defined in the second baffle.

3. The liquid heat-dissipating assembly as claimed in claim 2, wherein
the first tube has a flat rectangular cross section;
the at least one first channel in the first tube includes two first channels;
one first baffle is implemented in the first tube and between the two first channels;
the two first channels and the first spacing channel extend along a length of the first tube;
the second tube has a flat rectangular cross section;
the multiple second channels in the second tube include two second channels;
one second baffle is implemented in the second tube and between the two second channels; and
the two second channels and the second spacing channel extend along a length of the second tube.

4. The liquid heat-dissipating assembly as claimed in claim 3, wherein the passage in each heat-dissipating body is continuously curved.

5. The liquid heat-dissipating assembly as claimed in claim 4, wherein the multiple heat-dissipating units are arranged at two sides of the heat-guiding tube assembly.

6. The liquid heat-dissipating assembly as claimed in claim 5, wherein each one of the at least one heat-dissipating tube has a flat surface.

7. The liquid heat-dissipating assembly as claimed in claim 6, wherein the at least one heat-dissipating tube includes multiple heat-dissipating tubes; and
the multiple heat-dissipating tubes are connected in series with each other.

8. The liquid heat-dissipating assembly as claimed in claim 1, wherein the passage in each heat-dissipating body is continuously curved.

9. The liquid heat-dissipating assembly as claimed in claim 1, wherein each one of the at least one heat-dissipating tube has a flat surface.

10. A liquid heat-dissipating assembly comprising:
a heat-guiding tube assembly comprising
a first tube having at least one first channel defined in the first tube and a first peripheral wall formed around the at least one first channel;
a second tube being adjacent to and spaced from the first tube and having at least one second channel defined in the second tube and a second peripheral wall formed around the at least one second channel; and
a separating segment mounted between the first tube and the second tube and comprising a separating channel and multiple connection walls arranged around the separating channel and connected with the first peripheral wall and the second peripheral wall;
multiple heat-dissipating units connected with the heat-guiding tube assembly, and each heat-dissipating unit comprising
a heat-dissipating body having a passage defined in the heat-dissipating body and having two ends defined respectively as an inlet and an outlet;
a first pipe having two ends respectively connected with the inlet of the passage of the heat-dissipating body and the at least one first channel of the first tube; and
a second pipe having two ends respectively connected with the outlet of the passage of the heat-dissipating body and the at least one second channel of the second tube; and
at least one heat-dissipating tube connected with the at least one second channel of the second tube, wherein the at least one second channel includes multiple second channels; and
a second baffle is formed between each pair of adjacent two of the multiple second channels and has a second spacing channel defined in the second baffle.

11. The liquid heat-dissipating assembly as claimed in claim 10, wherein the passage in each heat-dissipating body is continuously curved.

12. The liquid heat-dissipating assembly as claimed in claim 10, wherein each one of the at least one heat-dissipating tube has a flat surface.

* * * * *